US007345944B1

(12) United States Patent
Jenkins, IV

(10) Patent No.: US 7,345,944 B1
(45) Date of Patent: Mar. 18, 2008

(54) PROGRAMMABLE DETECTION OF POWER FAILURE IN AN INTEGRATED CIRCUIT

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 86 days.

(21) Appl. No.: 11/329,646

(22) Filed: Jan. 11, 2006

(51) Int. Cl.
*G11C 13/00* (2006.01)
*G06F 1/26* (2006.01)

(52) U.S. Cl. ............... 365/229; 365/226; 713/310; 711/102; 711/154; 327/143

(58) Field of Classification Search .............. 326/9, 326/14; 365/229, 226; 711/100, 103; 327/143
See application file for complete search history.

(56) References Cited

U.S. PATENT DOCUMENTS

| 5,362,989 A | 11/1994 | Hennedy |
| 5,519,663 A * | 5/1996 | Harper et al. ............... 365/229 |
| 5,583,457 A | 12/1996 | Horiguchi et al. |
| 5,612,892 A | 3/1997 | Almulla |
| 5,615,162 A | 3/1997 | Houston |
| 5,671,149 A | 9/1997 | Brown |
| 5,682,107 A | 10/1997 | Tavana et al. |
| 5,712,790 A | 1/1998 | Ditlow et al. |
| 5,801,548 A | 9/1998 | Lee et al. |
| 5,825,662 A | 10/1998 | Trimberger |
| 5,914,873 A | 6/1999 | Blish, II |
| 5,946,257 A | 8/1999 | Keeth |
| 5,958,026 A | 9/1999 | Goetting et al. |
| 6,038,386 A | 3/2000 | Jain |
| 6,160,418 A | 12/2000 | Burnham |
| 6,169,419 B1 | 1/2001 | De et al. |
| 6,172,518 B1 | 1/2001 | Jenkins et al. |
| 6,208,171 B1 | 3/2001 | Kumagai et al. |
| 6,384,626 B2 | 5/2002 | Tsai et al. |
| 6,466,049 B1 | 10/2002 | Diba et al. |
| 6,489,804 B1 | 12/2002 | Burr |
| 6,583,645 B1 | 6/2003 | Bennett et al. |
| 6,631,502 B2 | 10/2003 | Buffet et al. |

(Continued)

OTHER PUBLICATIONS

U.S. Appl. No. 10/606,619, filed Jun. 26, 2003, New et al.

(Continued)

*Primary Examiner*—Vibol Tan
(74) *Attorney, Agent, or Firm*—LeRoy D. Maunu; Lois D. Cartier

(57) ABSTRACT

A programmable power-failure-detection circuit in an integrated circuit is provided that permits programmable selection of operating modes that either monitor a power supply of the integrated circuit or provide reduced power consumption from the power supply by disabling the monitoring of the power supply. The programmable power-failure-detection circuit includes at least one configurable memory cell, a monitor circuit, and a switch circuit disposed on the integrated circuit. The monitor circuit is adapted to monitor the power supply of the integrated circuit and generate a power failure signal in response to the power supply failing to comply with a prescribed operating specification. The switch circuit is coupled to the at least one configurable memory cell and the monitor circuit. The switch circuit is adapted to disable the monitor circuit in response to the at least one configurable memory cell.

17 Claims, 7 Drawing Sheets

U.S. PATENT DOCUMENTS

| | | | |
|---|---|---|---|
| 6,710,621 | B2 | 3/2004 | Devlin et al. |
| 6,711,719 | B2 | 3/2004 | Cohn et al. |
| 6,747,478 | B2 | 6/2004 | Madurawe |
| 6,839,888 | B2 | 1/2005 | Gupta |
| 6,885,563 | B2 | 4/2005 | Panella et al. |
| 6,920,627 | B2 | 7/2005 | Blodget et al. |
| 6,936,917 | B2 | 8/2005 | Lopata et al. |
| 6,950,998 | B1 | 9/2005 | Tuan |
| 6,960,934 | B2 | 11/2005 | New |
| 7,003,620 | B2 * | 2/2006 | Avraham et al. ............ 711/103 |
| 7,078,932 | B2 | 7/2006 | Swami |
| 7,080,341 | B2 | 7/2006 | Eisenstadt et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 2002/0008542 | A1 | 1/2002 | Tsai et al. |
| 2003/0030326 | A1 | 2/2003 | Shenai et al. |
| 2003/0173993 | A1 | 9/2003 | Gupta |
| 2003/0218478 | A1 | 11/2003 | Sani et al. |
| 2004/0103238 | A1 * | 5/2004 | Avraham et al. ............ 711/102 |
| 2004/0145955 | A1 | 7/2004 | Mizuno et al. |
| 2005/0040851 | A1 | 2/2005 | New |
| 2005/0091547 | A1 * | 4/2005 | Hanrieder et al. .......... 713/310 |
| 2005/0201174 | A1 | 9/2005 | Klein |
| 2005/0237083 | A1 | 10/2005 | Bakker et al. |
| 2006/0053246 | A1 * | 3/2006 | Lee ............................. 711/100 |
| 2006/0069851 | A1 * | 3/2006 | Chung et al. ............... 711/103 |
| 2006/0202713 | A1 | 9/2006 | Shumarayev |
| 2007/0001720 | A1 * | 1/2007 | Li et al. ..................... 327/143 |

OTHER PUBLICATIONS

U.S. Appl. No. 10/666,669, filed Sep. 19, 2003 Tuan et al.

U.S. Appl. No. 10/783,216, filed Feb. 20, 2004, Tuan et al.

U.S. Appl. No. 10/783,589, filed Feb. 20, 2004, Look et al.

Allen/Holberg; Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.

Microchip Techology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28, month unknown.

Shin'ichiro Mutoh et al.; "1 -V Power Supply High-speed Digital Circuit Technology with Multithreshold-Voltage CMOS"; IEEE Journal of Solid-State Circuits; Aug. 1995; vol. 30, No. 8, available from IEEE, 3 Park Avenue, 17th Floor, New York, NY 10016-5997; pp. 847-854.

T. Inukai et al.; "Boosted Gate MOS (BGMOS): Device/Circuit Cooperation Scheme to Achieve Leakage-Free Giga-Scale Integration"; IEEE 2000 Custom Integrated Circuits Conference; available from IEEE, 3 Park Avenue, 17th Floor, New York, NY 10016-5997; pp. 409-412, month unknown.

Tadahiro Kuroda et al.; "A 0.9-V, 150-MHz, 10-mW, 4 mm$^2$, 2-D Discrete Cosine Transform Core Processor with Variable Threshold-Voltage (VT) Scheme"; Nov. 1996; vol. 32, No. 11; available from IEEE, 3 Park Avenue, 17th Floor, New York, NY 10016-5997; pp. 1770-1779.

Fatih Hamzaoglu et al.; "Circuit-Level Techniques to Control Gate Leakage for sub-100nm CMOS"; ISLPED; Aug. 12-14, 2002; available from IEEE, 3 Park Avenue, 17th Floor, New York, NY 10016-5997;pp. 60-63.

Lei He; "Power Efficient FPGA: Circuit, Fabrics and CAD Algorithms"; Presentations on Feb. 13, 2004; available from EE Department, UCLA, at http://eda.ee.ucla.edu/; 50 pages.

FPGA 2004 Advance Program; "ACM/SIGDA Eleventh international Symposium on Field Programmable Gate Arrays"; Feb. 22-24, 2004; at Monterey Beach Hotel, Monterey, California,available at http://fpga2004.ece.ubc.ca/; 6 pages.

M. Takahashi et al.; "A 60-mW MPEG4 Video Codec Using Clustered Voltage Scaling with Variable Supply-Voltage Scheme"; Copyright 1998 IEEE; Nov. 1998; vol. 33, No. 11; available from IEEE Journal of Solid-State Circuits, IEEE, 3 Park Avenue, 17th Floor, New York, NY 10016-5997; pp. 1772-1780.

Jae Y. Park and Mark G. Allen; "A Comparison of Micromachined Inductors with Different Magnetic Core Materials"; Copyright 1996 IEEE; 1996 Electronic Components and Technology Conference; pp. 375-381, month unknown.

Thomas D. Burd et al.; "A Dynamic Voltage Scaled Microprocessor System"; Copyright 2000 IEEE; IEEE Journal of Solid-State Circuits, vol. 35, No. 11, Nov. 2000; pp. 1571-1580.

Anthony J. Stratakos et al.; "A Low-Voltage CMOS DC-DC Converter for a Portable Battery-Operated System"; Copyright 1994 IEEE; pp. 619-626, month unknown.

Anthony John Stratakos; "Abstract: High-Efficiency Low-Voltage DC-DC Conversion for Portable Applications," Chapter 3; "DC-DC Converter Fundamentals"; pp. 42-78, date unknown.

Xilinx, Inc.; "Virtex-II Pro Platform FPGA Handbook"; published Oct. 14, 2002; available from Xilinx, Inc., 2100 Logic Drive, San Jose, California 95124; pp. 19-71.

Xilinx, Inc.; "Spartan-3L Low Power FPGA Family"; Preliminary Product Specification, DS313; Sep. 15, 2005; v. 1.1; available from Xilinx, Inc., 2100 Logic Drive San Jose, California 95124; pp. 1-10.

Intel Corporation; "Intel PXA27x Processor Family Power Requirements"; Application Note; Copyright Intel Corporation 2004; pp. 1-36. Month Unknown.

Xilinx, Inc.; U.S. Appl. No. 10/971,934 by Jenkins IV filed on Oct. 22, 2004 by Xilinx, Inc.

Xilinx, Inc.; U.S. Appl. No. 11/268,265 by Rahman et al. filed on Nov. 4, 2005 by Xilinx, Inc.

Xilinx, Inc.; U.S. Appl. No. 11/325,888 by Tuan filed on Jan. 4, 2006 by Xilinx, Inc.

Xilinx, Inc.; U.S. Appl. No. 11/326,542 by Jacobson et al. filed on Jan. 4, 2006 by Xilinx, Inc.

Xilinx, Inc.; U.S. Appl. No. 11/502,939 by Tuan et al. filed on Aug. 11, 2006 by Xilinx, Inc.

Nowka, Kevin; "A 32-bit PowerPC System-on-a-Chip with Support for Dynamic Voltage Scaling and Dynamic Frequency Scaling"; Nov. 2002, vol. 37. No. 11; IEEE Journal of Solid-State Circuits; Copyright 2002 IEEE; pp. 1441-1447.

Texas Instruments (BenchMARq); bq4011/bq4011Y (32Kx8 Nonvolatile SRAM); Aug. 1993; Copyright 1999; pp. 1-11.

Texas Instruments; "32k x 8 Nonvolatile SRAM (5V, 3.3V)"; bq4011/Y/LY; May 1999 revised May 2007; Copyright 1999-2007; pp. 1-15.

* cited by examiner

US 7,345,944 B1

PROGRAMMABLE DETECTION OF POWER FAILURE IN AN INTEGRATED CIRCUIT

FIELD OF THE INVENTION

The present invention generally relates to power failure detection circuits, and more particularly to integrated circuits including a power failure detection circuit.

BACKGROUND

The correct operation of an integrated circuit may depend upon a power supply of the integrated circuit complying with an operating specification, for example, the voltage of the power supply remaining within an allowed voltage range. If the power supply of the integrated circuit fails to comply with the operating specification, the integrated circuit may operate incorrectly, for example, the values stored in memory cells of the integrated circuit may be corrupted. Corruption of memory cells may cause continued improper operation of the integrated circuit. For example, an integrated circuit may provide various operating mode registers that are initialized at the startup of an application using the integrated circuit, and corruption of an operating mode register may enable an operating mode that is unsuitable for the application.

An integrated circuit may provide a power failure detection circuit that detects whether the power supply of the integrated circuit fails to comply with the operating specification for the power supply. In response to the power supply failing to comply with the operating specification, the power failure detection circuit may generate a reset of the integrated circuit. The reset may cause the application to be restarted, such that the potentially corrupted memory cells are reinitialized, including reinitializing any mode registers. Alternatively, the reset may cause the operation of the integrated circuit to be temporarily suspended; however, continuous improper operation may be prevented.

Certain applications using an integrated circuit require very low power dissipation. For example, an application may be powered by a non-rechargeable battery that is required to last for several years. Continuous monitoring of the power supply by a power failure detection circuit may cause continuous power dissipation that exceeds the power that can be supplied by a battery over the required lifetime of the battery.

The present invention may address one or more of the above issues.

SUMMARY OF THE INVENTION

Various embodiments of the invention provide a programmable power-failure-detection circuit including at least one configurable memory cell, a monitor circuit, and a switch circuit disposed on an integrated circuit. The monitor circuit is adapted to monitor a power supply of the integrated circuit and generate a power failure signal in response to the power supply failing to comply with a prescribed operating specification. The switch circuit is coupled to the at least one configurable memory cell and the monitor circuit. The switch circuit is adapted to disable the monitor circuit in response to the at least one configurable memory cell.

Various other embodiments of the invention provide a programmable logic device (PLD) including an array of programmable logic and routing resources, configurable memory cells, and a programmable power-failure-detection circuit. The programmable power-failure-detection circuit includes a monitor circuit and a switch circuit. The monitor circuit is adapted to monitor a power supply of the PLD and generate a power failure signal in response to the power supply failing to comply with a prescribed operating specification. The switch circuit is coupled to the configurable memory cells and the monitor circuit. The switch circuit is adapted to disable the monitor circuit in response to at least one of the configurable memory cells.

Various additional embodiments of the invention provide a method of operating an arrangement including at least one integrated circuit. Respective configuration data is loaded into configuration memory of at least one integrated circuit of the arrangement in response to a first reset. A power supply of the arrangement is monitored in response to a first value of at least one configurable memory cell. The monitoring includes generating a second reset in response to the power supply failing to comply with a prescribed operating specification. The respective configuration data is loaded into the configuration memory of the at least one integrated circuit in response to the second reset. Monitoring of the power supply of the arrangement is bypassed in response to a second value of the at least one configurable memory cell.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
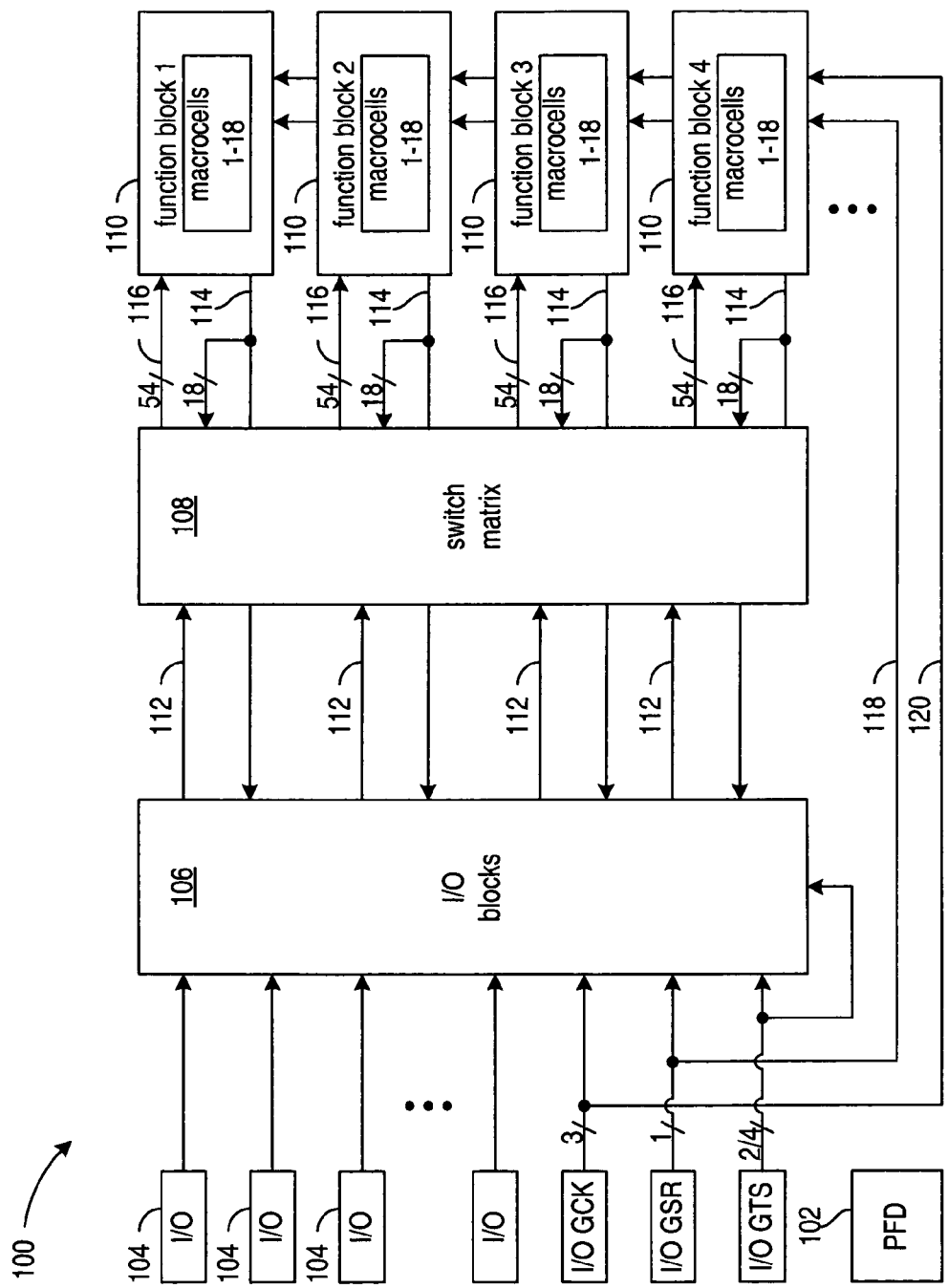
FIG. 1 is a simplified illustration of an example CPLD including a power-failure detection circuit in accordance with various embodiments of the invention.

FIG. 1 shows a simplified block diagram of a CPLD 100 that includes a power-failure detection circuit 102 in accordance with various embodiments of the invention. The example CPLD 100 includes input/output (I/O) pins 104, I/O blocks (IOBs) 106, an interconnect switch matrix 108, and several function blocks (FBs) 110 (four shown). IOBs 106 provide buffering for device input and output signals that are applied to I/O pins 104. The input signals from IOBs 106 enter switch matrix 108 on switch matrix input lines 112, and selected output signals from FBs 110 are fed back into switch matrix 108 on macrocell output lines 114. In the example CPLD, each FB 110 receives fifty-four (54) input signals on FB input lines 116 from switch matrix 108 and produces ninety (90) product-term signals that are applied to any of eighteen (18) macrocells, each macrocell being programmable to provide a sum-of-products term using selected product-term signals. For each FB 110, twelve to eighteen output signals are selectively transmitted on macrocell output lines 114 to directly drive I/O blocks 106 (along with optional corresponding output enable signals). In addition, each FB 110 selectively receives global set/reset signals and global clock signals on global set/reset lines 118 and global clock lines 120, respectively. These global signals are utilized to selectively synchronize, for example, the clocking operations of flip flops located in FBs 110.

In some CPLDs, configuration data is stored on-chip in non-volatile memory. In other CPLDs, configuration data is stored on-chip in non-volatile memory, then downloaded to volatile memory as part of an initial configuration sequence. The power-failure detection circuit 102 may generate a reset that initiates the configuration sequence that downloads configuration data from on-chip non-volatile memory into on-chip volatile memory.

Further information on CPLDs can be found, for example, in U.S. Pat. No. 6,466,049 B1 by Sholeh Diba et al., issued Oct. 15, 2002, which is hereby incorporated herein by reference. Those skilled in the art will recognize that the illustrated CPLD architecture is an example and will appreciate that other CPLD architectures may benefit from the various embodiments of the invention.

Figure 2:
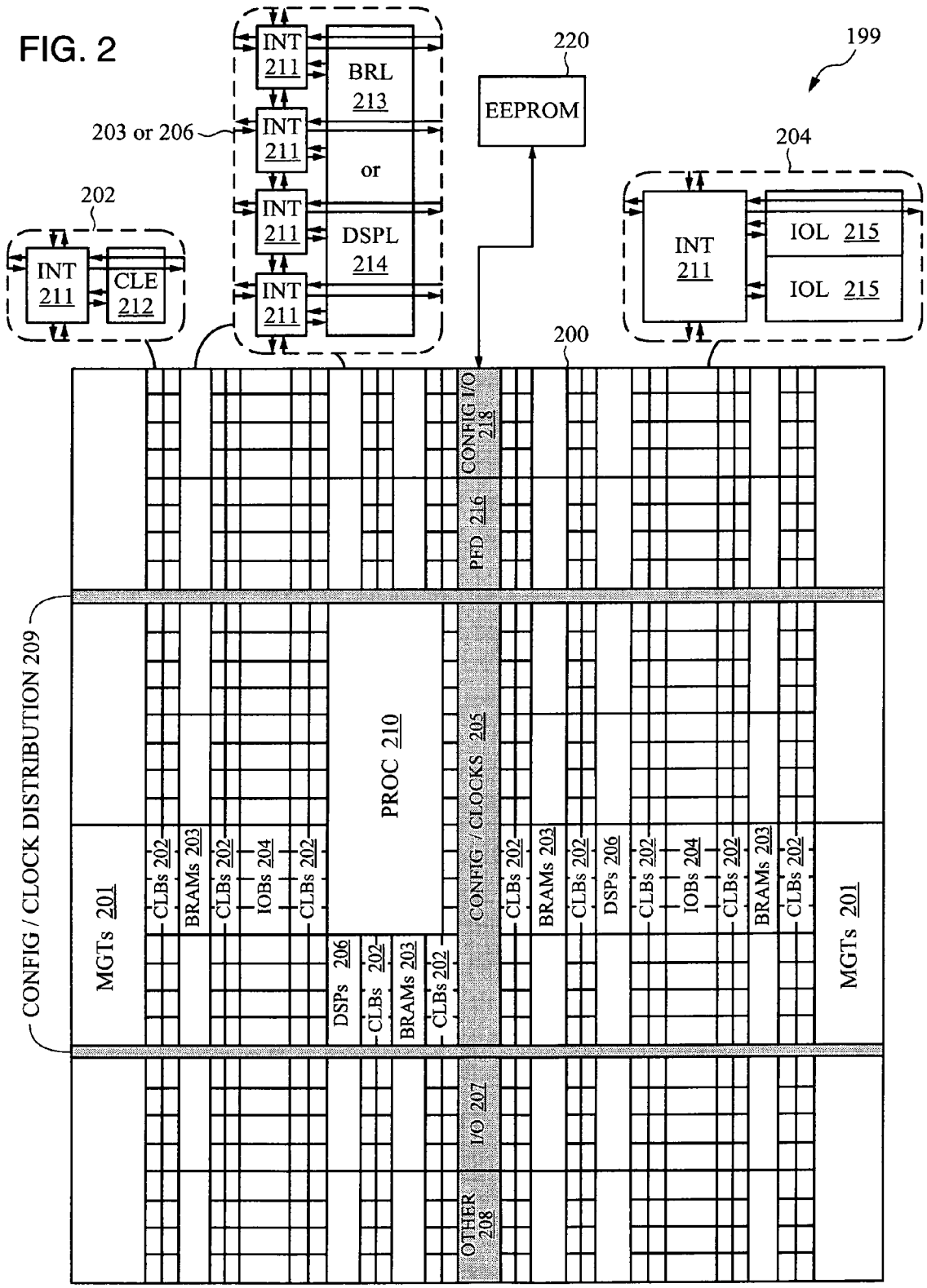
FIG. 2 is a block diagram of a particular PLD arrangement that includes power-failure detection circuit in accordance with various embodiments of the invention.

FIG. 2 is a block diagram of a particular PLD arrangement 199 that includes power-failure detection circuit 216 in accordance with various embodiments of the invention. The PLD 200 may be programmed with configuration data from the EEPROM 220 during reset of the PLD 200. In one embodiment, power-failure detection circuit 216 generates a reset of PLD 200 when a power supply for PLD 200 is no longer within specified operating limits.

Certain PLDs, such as advanced FPGAs, can include an array of programmable tiles having several different types of programmable logic and routing resources. For example, the PLD 200 of FIG. 2 illustrates an FPGA architecture that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., clock ports), configuration I/O port 218, programmable power-fail-detection circuit 216, and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Configuration data from EEPROM 220 may be loaded into configurable memory cells in the programmable logic and routing resources 201, 202, 203, 204, 206, and 208 via configuration I/O port 218, CONFIG/CLOCKS 205, and the configuration distribution signals of areas 209.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Those skilled in the art will appreciate that other FPGA architectures may benefit from the various embodiments of the invention.

One such FPGA, the Xilinx Virtex-II Pro FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124, which pages are incorporated herein by reference.

Figure 3:
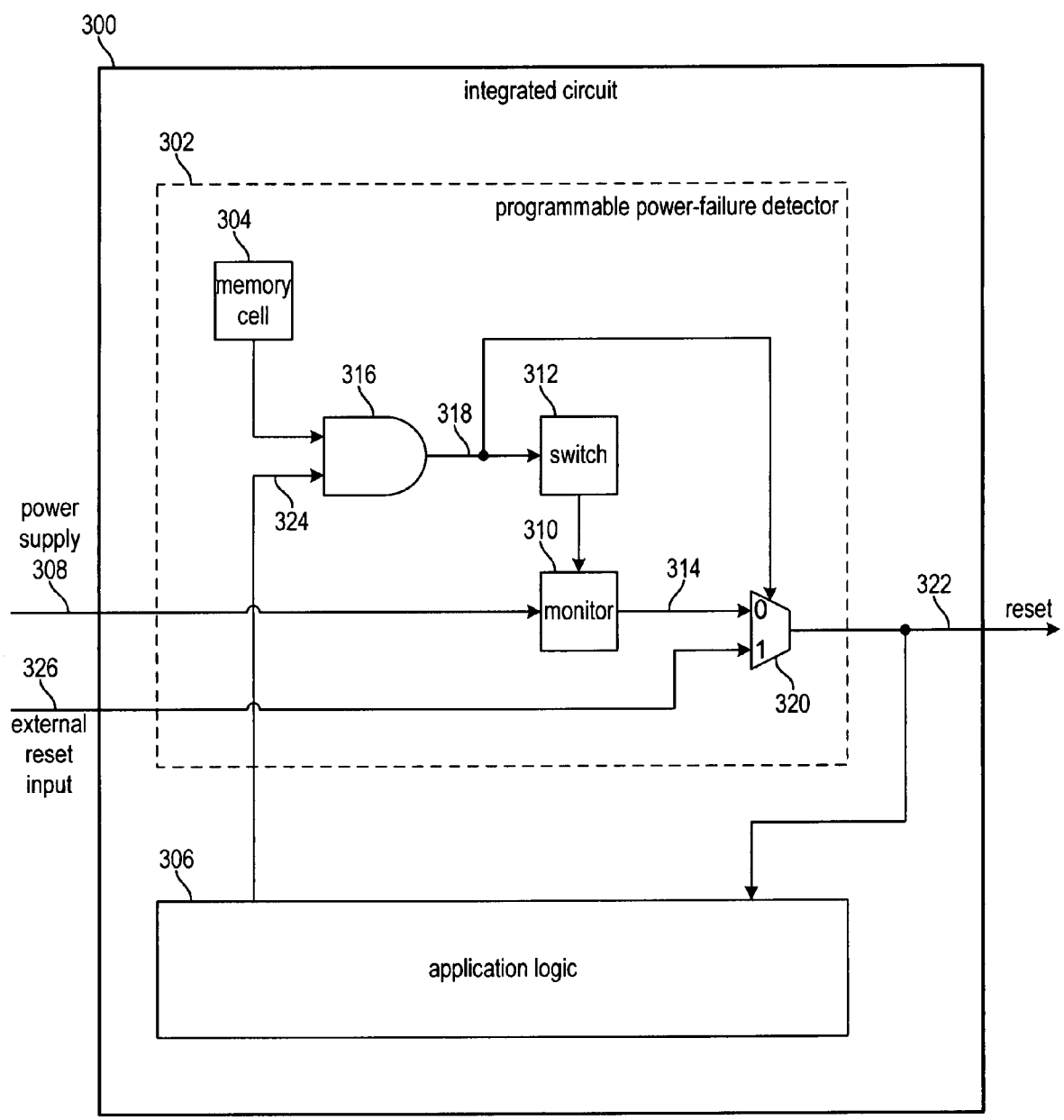
FIG. 3 is a block diagram of an integrated circuit including a programmable power-failure detection circuit in accordance with various embodiments of the invention.

FIG. 3 is a block diagram of an integrated circuit 300 including a programmable power-failure detection circuit 302 in accordance with various embodiments of the invention. The power-failure detection circuit 302 is programmable by the value stored in configurable memory cell 304, with the power-failure detection circuit 302 always enabled for a default value of the memory cell 304, and the power-failure detection circuit enabled or disabled as controlled by application logic 306 for another value of the memory cell 304. In one embodiment, configurable memory cell 304 is a bit of erasable programmable read-only memory (EPROM) or another non-volatile memory that is programmed with configuration data that selects the operating mode of the power-failure detection circuit 302. In another embodiment, configurable memory cell 304 is a bit of static random access memory (SRAM) that is initialized with configuration data from a non-volatile memory during reset of integrated circuit 300.

A power supply on line 308 of the integrated circuit 300 may be monitored by monitor 310 for compliance with a prescribed operating specification, such as an allowed voltage range for the power supply on line 308. The monitoring of the power supply on line 308 by monitor 310 may be disabled by switch 312. Power consumption from the power supply on line 308 by the monitor 310 may be reduced when the monitor 310 is disabled by switch 312. When enabled by switch 312, monitor 310 may generate a power failure signal on line 314 whenever the power supply on line 308 fails to comply with the operating specification.

AND gate 316 may output a value of zero on line 318 when memory cell 304 has a default value of zero, and the value of zero on line 318 may cause switch 312 to enable monitor 310 and also cause multiplexer 320 to select the power failure signal on line 314 to output as a reset signal on line 322. The reset signal on line 322 may reset the application logic 306 and/or reset circuits external to integrated circuit 300 that are coupled to the reset signal on line 322. Thus, for a value of zero for memory cell 304, a reset signal on line 322 may be generated whenever the power supply on line 308 fails to comply with the operating specification. The operation of the application logic 306 may be corrupted when the power supply on line 308 is out of specification, and the reset signal on line 322 may reinitialize the application logic 306 until the power supply on line 308 comes back into specification.

When the memory cell 304 has a value of one, the value output on line 318 by AND gate 316 may follow the control input supplied on line 324 by the application logic 306. Depending upon the application requirements, the application logic 306 may enable or disable monitor 310 when the memory cell 304 has a value of one. For an application needing to continuously monitor the power supply on line 308, the application logic 306 may drive a value of zero on line 324 to enable the monitor 310. For an application requiring low-power operation and not requiring continuous monitoring of the power supply, the application logic 306 may drive a value of one on line 324 to disable the monitor 310 and also to reduce the power consumption of the monitor 310. For an application alternately requiring low-power operation and monitoring of the power supply, the application logic 306 may drive a value of one on line 324 during the required low-power operation and a value of zero on line 324 during the required monitoring of the power supply.

During disabling of the monitor 310 for a value of one on line 318, the monitor 310 may never generate a power failure signal on line 314. During disabling of the monitor 310, the value of one on line 318 may control multiplexer 320 to select an external reset input on line 326 instead of the inactive power failure signal on line 314. Thus, an application that disables internal monitoring of the power supply may rely instead on an external circuit that generates a reset signal coupled to line 326 when the power supply on line 308 fails to comply with the prescribed operating specification. An example external circuit for monitoring the power supply is the MCP102 micro-power voltage supervisor available from Microchip Technology Inc.

Figure 4:
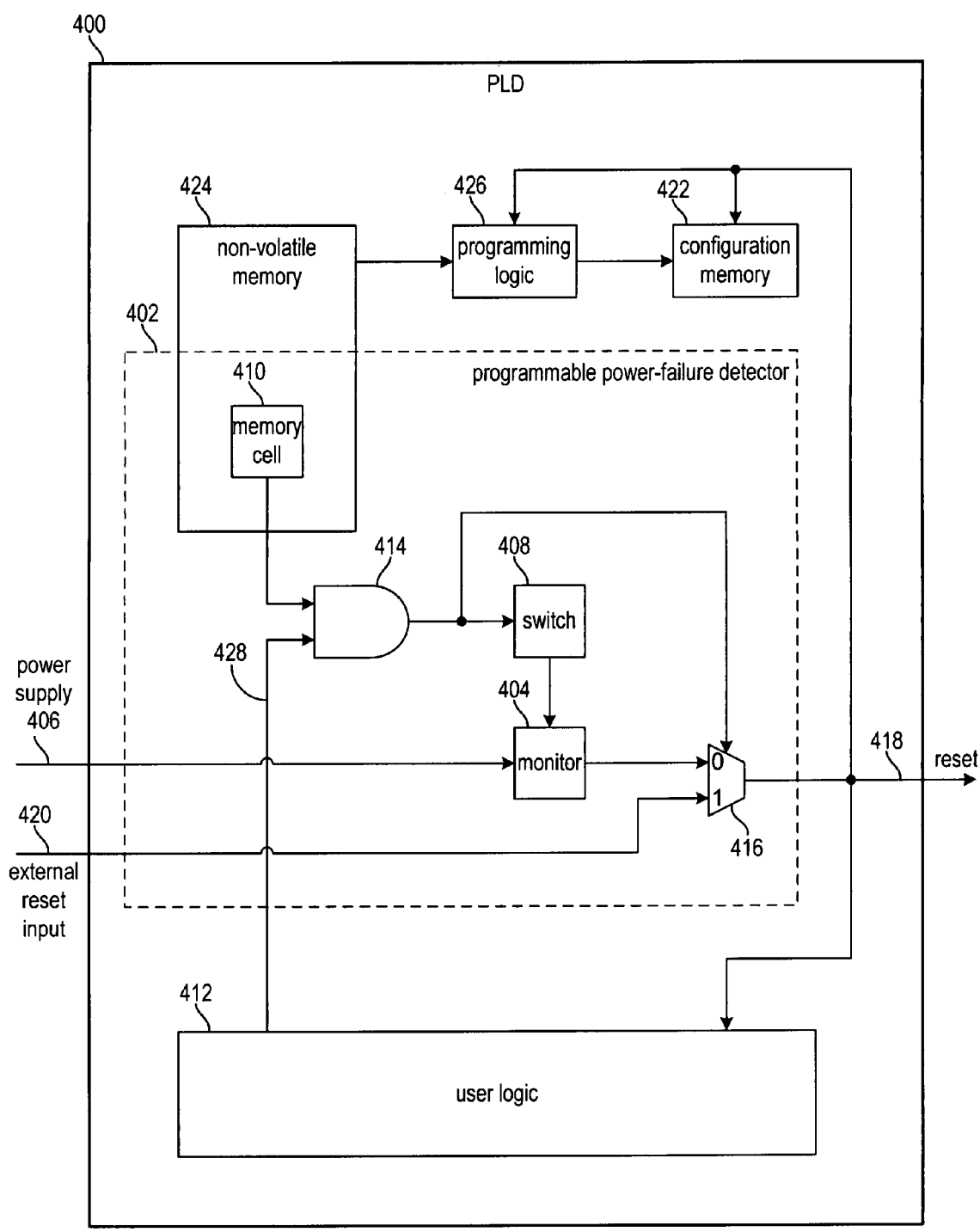
FIG. 4 is a block diagram of a PLD including a programmable power-failure detection circuit in accordance with various embodiments of the invention.

FIG. 4 is a block diagram of a PLD 400 including a programmable power-failure detection circuit 402 in accordance with various embodiments of the invention. A monitor 404 may monitor a power supply on line 406 of the PLD 400. To reduce power consumption by the monitor 404, a switch 408 may disable the monitor 404 as controlled by configurable memory cell 410 and user logic 412 via AND gate 414. When the monitor 404 is enabled, multiplexer 416 selects a reset signal on line 418 from the monitor, and when the monitor is disabled, multiplexer 416 selects a reset signal on line 418 from an external reset input on line 420.

The configuration memory 422 may be SRAM that is programmed with configuration data from non-volatile memory 424 to implement the user logic 412 in the programmable logic and routing resources of PLD 400. The SRAM of the configuration memory 422 may become corrupted if the power supply on line 406 goes out of specification, and the corruption of the SRAM could corrupt the user logic 412 implemented in PLD 400. While the monitor 404 is enabled, an active reset signal on line 418 is generally generated before corruption of configuration memory 422 occurs, and the active reset signal generally continues until after the power supply on line 406 has been restored to proper operating conditions. While active, the reset signal on line 418 may clear the contents of configuration memory 422, such that the user logic 412 is cleared from the programmable logic and routing resources of PLD 400. When the reset signal on line 418 transitions to inactive, the programming logic 426 may reinitialize configuration memory 422 with the configuration data from non-volatile memory 424. It will be appreciated that the user logic 412 may receive a reset signal (not shown) from programming logic 426 that is asserted while the reset signal on line 418 is asserted, and continues to be asserted until after the programming logic 426 has completed the initialization of the configuration memory 422 with the configuration data from non-volatile memory 424.

The monitor 404 may be disabled when the non-volatile memory 424 includes configuration data that sets memory cell 410 to a value of one, and when this configuration data also implements user logic 412 that outputs a value of one on the control input on line 428 of detector 402. The user logic 412 may output a value of one on line 428 continuously or intermittently depending upon the requirements of the application. While the monitor 404 is disabled, monitor 404 cannot detect that the power supply on line 406 is out of specification. If the power supply goes out of specification while the monitor 404 is disabled, the contents of configuration memory 422 may become corrupted and the user logic 412 may also become corrupted. Thus, a user application generally should not disable the monitor 404 unless the power supply on line 406 is known a priori to be stable within prescribed specifications or an external circuit monitors the power supply on line 406 and generates a reset input on line 420 whenever the power supply goes out of specification.

For a user application 412 that intermittently disables the monitor 404, a reset on line 418 generated by an enabled monitor 404 may clear configuration memory 422 and consequently clear user logic 412 from the programmable logic and routing resources of PLD 400. Generally, while configuration memory 422 is cleared the value generated on line 428 is always zero, such that the monitor 404 is enabled. Thus, after a reset is generated on line 418, the user logic 412 cannot disable the monitor 404 until after the power supply on line 406 comes back into specification and the configuration data in non-volatile memory 424 is loaded by programming logic 426 into configuration memory 422.

It will be appreciated that PLD 400 may be a CPLD as illustrated in FIG. 1 or an FPGA as illustrated in FIG. 2 that additionally includes a non-volatile memory for the configuration data.

Figure 5:
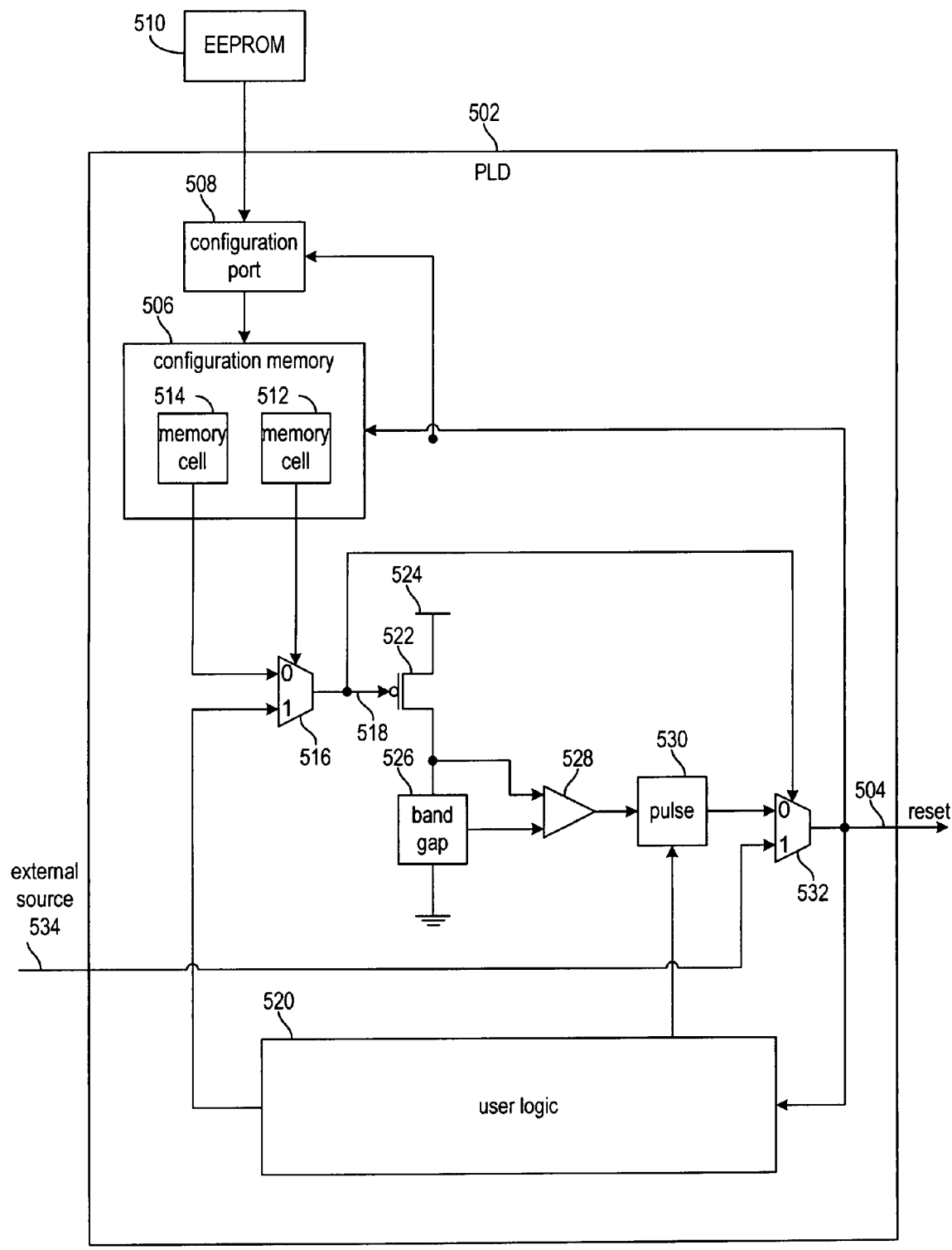
FIG. 5 is a block diagram of another PLD including programmable power-failure detection in accordance with various embodiments of the invention.

FIG. 5 is a block diagram of a PLD 502 including programmable power-failure detection in accordance with various embodiments of the invention. A reset on line 504 may clear configuration memory 506 and the termination of the reset on line 504 may cause configuration I/O port 508 to load configuration data from external EEPROM 510 into configuration memory 506, including providing values for configurable memory cells 512 and 514.

The values of memory cells 512 and 514 of configuration memory 506 may determine whether power-failure detection is enabled or disabled in PLD 502. Multiplexer 516 may output a value of zero on line 518 that enables power-failure detection by PLD 502 for the default value of zero for memory cells 512 and 514. For a value of zero for memory cell 512 and a value of one for memory cell 514, multiplexer 516 may output a value of one on line 518 that disables power-failure detection by PLD 502. For a value of one of memory cell 512 and regardless of the value of memory cell 514, user logic 520 may control whether power-failure detection is enabled or disabled in PLD 502.

A value of zero on line 518 may switch on transistor 522 and enable power-failure detection in PLD 502 by allowing power to be supplied from power supply 524 to band gap circuit 526 and comparator 528. Band gap circuit 526 may generate a voltage reference that is the voltage drop of a forward-biased diode, the turn-on threshold voltage of a transistor, or a similar voltage or current reference. In certain embodiments, band gap circuit 526 generates a reference voltage with reduced temperature dependence by combining the voltage of a forward-biased diode and the turn-on threshold voltage of a transistor. Comparator 528 may compare the reference voltage from the band gap circuit 526 with a voltage from the power supply 524, using a resistive voltage divider (not shown), for example. While the voltage from the power supply 524 is less than a prescribed minimum voltage, comparator 528 may generate a power failure signal that is provided to pulse shaping circuit 530. It will be appreciated the PLD 502 may include similar circuits that generate a power failure signal while the voltage from the power supply 524 is greater than a prescribed maximum voltage.

In one embodiment, the band gap circuit 526 consumes ten microamperes of current from the power supply 524 while power failure detection is enabled, and this consumption of current from the power supply 524 may be essentially eliminated while power failure detection is disabled. A value of one on line 518 may switch off transistor 522 and disable power-failure detection in PLD 502 by substantially preventing power from being supplied to band gap circuit 526 and comparator 528 from power supply 524.

In addition to enabling power failure detection, a value of zero on line 518 may control multiplexer 532 to provide a reset signal on line 504 from the pulse shaping circuit 530. Similarly, in addition to disabling power failure detection by PLD 502, a value of one on line 518 may control multiplexer 532 to provide a reset signal on line 504 from on external source on line 534.

The pulse shaping circuit 530 may stretch the duration of a detection of a power failure to ensure that each reset pulse on line 504 has at least a particular duration. The pulse shaping circuit 530 may receive data from user logic 520 and/or configuration memory 506 to allow the duration of each reset pulse on line 504 to be extended according to the requirements of the user application. Generally, the pulse shaping circuit 530 may sample this pulse extension data before outputting a reset pulse that clears the contents of the configuration memory 506 and consequently clears the user logic 520 from the programmable logic and routing resources of the PLD 502.

It will be appreciated that PLD 502 may include a power-on-reset generator (not shown) in addition to a programmable power-failure detector. An example power-on-reset generator may include a circuit between the power supply 524 and ground potential that is a resistance in series with a capacitance. The power-on-reset generator may produce a power-on-reset signal for a time period after initial power-on that is dependent on the time constant of the resistance and the capacitance. The power-on reset may clear configuration memory 506, preventing the PLD 502 from having random values in configuration memory 506 that disable the programmable power-failure detection circuit after power-on. The termination of the power-on reset may also start the loading of configuration data from EEPROM 510 into configuration memory 506 by I/O configuration port 508. After the capacitance is charged through the resistance, the power-on-reset generator may cease drawing power from the power supply 524, and thus does not need to be disabled. However, the power-on-reset generator may not be able to respond to the power supply 524 briefly of marginally going out of specification in a manner that may corrupt the contents of configuration memory 506. The programmable power-failure detection circuit may independently generate a reset of PLD 502 whenever the power supply 524 has the "brownout" condition of going briefly or marginally out of specification.

Figure 6:
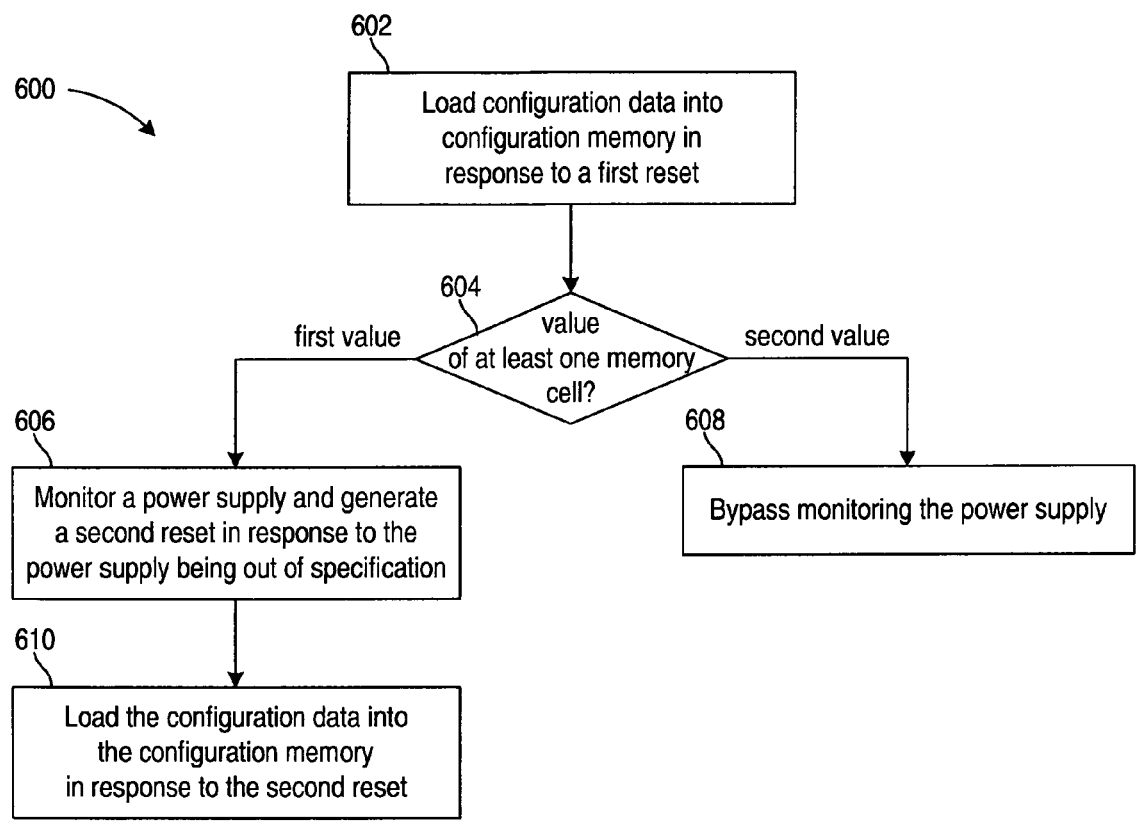
FIG. 6 is a flow diagram of a process for operating a PLD in accordance with various embodiments of the invention.

FIG. 6 is a flow diagram of a process 600 for operating a PLD in accordance with various embodiments of the invention. At step 602, a reset causes configuration data to be loaded into configuration memory of the PLD. The reset may be an initial power-on reset for the PLD. Loading the configuration data into configuration memory of the PLD may implement user logic in the PLD. Decision 604 checks the value of at least one configurable memory cell of the PLD. The configurable memory cells may be non-volatile memory cells of the PLD or volatile memory cells of the PLD that are initialized from the configuration data at step 602. For a first value, process 600 proceeds to step 606, and for a second value, process 600 proceeds to step 608.

At step 606, a power supply of the PLD is monitored and a second reset is generated in response to the power supply failing to comply with a prescribed operating specification. At step 610, the configuration data is again loaded into the configuration memory of the PLD in response to the second reset.

At step 608, the monitoring of the power supply is bypassed. Power consumption from the power supply by the PLD may be reduced during bypassing of the monitoring of the power supply.

Figure 7:
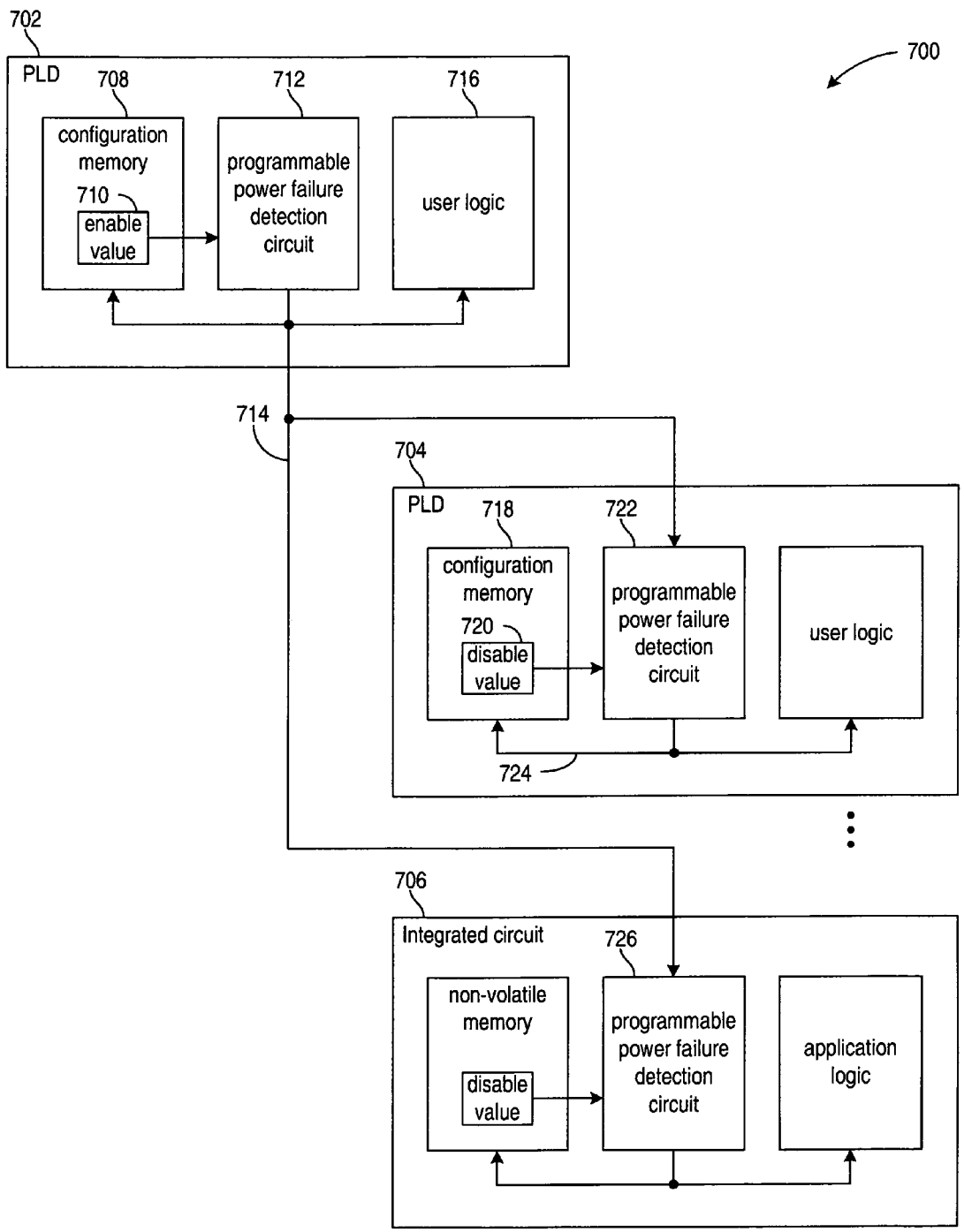
FIG. 7 is a block diagram of a circuit arrangement having a PLD generate a reset for other integrated circuits in accordance with various embodiments of the invention.

FIG. 7 is a block diagram of a circuit arrangement 700 having a PLD 702 generate a reset for other integrated circuits 704 and 706 in accordance with various embodiments of the invention. PLD 702 may have a configuration memory 708 that includes a configurable memory cell 710 providing an enable value to the programmable power-failure-detection circuit 712. The programmable power-failure-detection circuit 712 may monitor a power supply of PLD 702 and generate a reset signal on line 714 while the power supply fails to comply with a prescribed operating specification. The reset signal on line 714 may reset the configuration memory 708 and consequently clear the user logic 716 from the programmable logic and routing resources of PLD 702. In response to termination of the reset signal on line 714 when the power supply comes back into specification, programming logic (not shown) of PLD 702 may reload configuration data into the configuration memory 708 to restore the user logic 716.

PLD 704 may have a configuration memory 718 that includes a configurable memory cell 720 providing a disable value to the programmable power-failure-detection circuit 722. The disable value of configurable memory cell 720 may reduce the power consumption of programmable power-failure-detection circuit 722 and select the externally provided reset signal on line 714 for the internal reset signal on line 724 of PLD 704. Thus, PLD 704 may be reset when PLD 702 detects a power supply is out of specification. The reset of PLD 704 when PLD 702 detects a power supply is out of specification may be appropriate, for example, when PLDs 702 and 704 share a power supply of the arrangement. Integrated circuit 706 may similarly be reset by PLD 702. It will be appreciated that PLDs 702 and 704 may be a particular type of integrated circuit and integrated circuit 706 may also be a PLD. Arrangement 700 may have a single enabled programmable power-failure-detection circuit 712 in PLD 702 and disabled programmable power-failure-detection circuits 722 and 726. Arrangement 700 may monitor the power supply and also reduce power consumption because only a single enabled programmable power-failure-detection circuit 712 is enabled.

The present invention is thought to be applicable to a variety of systems for detecting power failures. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable power-failure-detection circuit, comprising:
    at least one configurable memory cell disposed on an integrated circuit;
    a monitor circuit disposed on the integrated circuit, the monitor circuit adapted to monitor a power supply of the integrated circuit and generate a power failure signal in response to the power supply failing to comply with a prescribed operating specification;
    a control input; and
    a switch circuit disposed on the integrated circuit and coupled to the at least one configurable memory cell and the monitor circuit, the switch circuit adapted to disable the monitor circuit in response to the at least one configurable memory cell,
    wherein the switch circuit is further adapted to disable the monitor circuit in response to the control input for a value of the at least one configurable memory cell, and
    wherein the at least one configurable memory cell is adapted to be programmed from a non-volatile memory in response to the power failure signal.

2. The circuit of claim 1, wherein the at least one configurable memory cell is further adapted to be cleared in response to the power failure signal prior to being programmed from the non-volatile memory in response to the power failure signal.

3. The circuit of claim 1, wherein the monitor circuit is further adapted to reduce power dissipation from the power supply in response to being disabled by the switch circuit.

4. The circuit of claim 1, wherein the monitor circuit includes a band gap circuit.

5. The circuit of claim 1, wherein the switch circuit is arranged to interrupt a coupling between the power supply and at least a portion of the monitor circuit in response to the at least one configurable memory cell.

6. A programmable power-failure-detection circuit, comprising:
    at least one configurable memory cell disposed on an integrated circuit;
    a monitor circuit disposed on the integrated circuit, the monitor circuit adapted to monitor a power supply of the integrated circuit and generate a power failure signal in response to the power supply failing to comply with a prescribed operating specification;
    a switch circuit disposed on the integrated circuit and coupled to the at least one configurable memory cell and the monitor circuit, the switch circuit adapted to disable the monitor circuit in response to the at least one configurable memory cell; and
    a reset output that is coupled to the power failure signal responsive to a first value of the at least one configurable memory cell.

7. The circuit of claim 6 further comprising a reset input, wherein the reset output is coupled to the reset input responsive to a second value of the at least one configurable memory cell.

8. The circuit of claim 7, wherein the switch circuit is further adapted to disable the monitor circuit in response to the second value of the at least one configurable memory cell.

9. The circuit of claim 6, wherein the at least one configurable memory cell is adapted to be cleared in response to the reset output and subsequently programmed from a non-volatile memory.

10. A programmable logic device (PLD), comprising:
    an array of programmable logic and routing resources;
    a plurality of configurable memory cells; and
    a programmable power-failure-detection circuit, including:
        a monitor circuit adapted to monitor a power supply of the PLD and generate a power failure signal in response to the power supply failing to comply with a prescribed operating specification,
        a switch circuit coupled to the configurable memory cells and the monitor circuit, the switch circuit adapted to disable the monitor circuit in response to at least one of the configurable memory cells, and
        a pulse circuit adapted to generate a pulse of a reset signal in response to the power failure signal.

11. The PLD of claim 10, wherein the pulse circuit is further adapted to provide control of the pulse of the reset signal from a user design implemented in the array of programmable logic and routing resources.

12. The PLD of claim 10, wherein for a value of the at least one of the configurable memory cells the switch circuit is further adapted to disable the monitor circuit in response to a control signal from a user design implemented in the array of programmable logic and routing resources.

13. The PLD of claim 10, wherein the configurable memory cells are adapted to be programmed from a non-volatile memory that is one of external to the PLD and included in the PLD.

14. A method of operating an arrangement including at least one integrated circuit, comprising:
    loading respective configuration data into configuration memory of at least one integrated circuit of the arrangement in response to a first reset;

monitoring a power supply of the arrangement in response to a first value of at least one configurable memory cell, the monitoring including generating a second reset in response to the power supply failing to comply with a prescribed operating specification;

loading the respective configuration data into the configuration memory of the at least one integrated circuit in response, to the second reset; and bypassing monitoring the power supply of the arrangement in response to a second value of the at least one configurable memory cell.

15. The method of claim 14 further comprising inputting the second reset at an input of at least one integrated circuit of the arrangement.

16. The method of claim 14 further comprising outputting the second reset at an output of a first integrated circuit of the arrangement.

17. The method of claim 16, further comprising inputting the second reset at an input of at least one second integrated circuit of the arrangement, wherein the respective configuration data for the first integrated circuit includes the first value for the at least one configurable memory cell and the respective configuration data for each second integrated circuit includes the second value for the at least one configurable memory cell.

* * * * *